United States Patent [19]
Yamaguchi et al.

[11] Patent Number: 4,868,068
[45] Date of Patent: Sep. 19, 1989

[54] IC WIRING CONNECTING METHOD AND RESULTING ARTICLE

[75] Inventors: Hiroshi Yamaguchi, Fujisawa; Mikio Hongo, Yokohama; Tateoki Miyauchi, Yokohama; Akira Shimase, Yokohama; Satoshi Haraichi, Yokohama; Takahiko Takahashi, Tokyo; Keiya Saito, Yokohama, all of Japan

[73] Assignee: Hitachi, Ltd., Tokyo, Japan

[21] Appl. No.: 32,753

[22] Filed: Mar. 31, 1987

[30] Foreign Application Priority Data

Mar. 31, 1986 [JP] Japan ................................. 61-70979

[51] Int. Cl.⁴ ............................................. B21C 27/00
[52] U.S. Cl. ................................ 428/596; 204/192.1; 427/38; 427/42; 427/53.1; 427/97; 427/99; 427/252; 427/261; 427/289; 427/307; 427/404; 427/419.2; 428/457; 428/471; 428/901
[58] Field of Search .................. 427/53.1, 97, 99, 289, 427/252, 42, 38, 404, 419.2, 307, 261; 204/192.1; 428/596, 457, 471, 901

[56] References Cited
U.S. PATENT DOCUMENTS 4,657,778  4/1987  Moran ..................................... 427/97

*Primary Examiner*—Bernard Pianalto
*Attorney, Agent, or Firm*—Antonelli, Terry & Wands

[57] ABSTRACT

A IC wiring connecting method for interconnecting conductive lines of the same wiring plane of an IC chip for correcting the wiring, for interconnecting conductive lines of different wiring lanes of a multilayer IC chip at the same position, or for connecting a conductive line of a lower wiring plane of a multilayer IC chip to a conductive line formed at a separate position on the same multilayer IC chip. The insulating film or films covering conductive lines to be interconnected are processed by an energy beam such as a concentrated ion beam to form holes so as to expose the respective parts of the conductive lines where the conductive lines are to be interconnected, then a metal is deposited over the surfaces of the holes and an area interconnecting the holes by irradiating the surfaces of the holes and the area by an energy beam or a concentrated ion beam in an atmosphere of a gaseous organic metal compound to form a conductive metal film electrically interconnecting the conductive lines. Also provided is an apparatus for carrying out the IC wiring connecting method, which comprises, as essential components, an ion beam material processing system, an insulating film forming system such as a laser induced CVD unit, a conductive film forming system, and an insulating film etching system.

43 Claims, 12 Drawing Sheets

IC WIRING CONNECTING METHOD AND RESULTING ARTICLE

BACKGROUND OF THE INVENTION

The present invention relates to an IC wiring connecting method for connecting the internal wirings of a semiconductor integrated circuit (hereinafter abbreviated to "IC") for debugging, correcting and analyzing faults, and an apparatus for carrying out the IC wiring connecting method.

The significance of finding incorrect design and faulty processes by cutting or connecting part of the internal wirings of a large-scale integrated circuit chip (hereinafter, abbreviated to "LSI chip") for debugging and correcting faults in the stage of development and improving the yield of the IC chip production line by reflecting the results of fault analysis on the process conditions has increased with the progressive increase in the density of integration and miniaturization of ICs. Several technical means utilizing a laser beam or an ion beam for such purposes have been proposed.

A first prior art is disclosed in "Laser Strip Cutting System for IC Debugging", Tech. Digest of CLEO'80, (1981) p. 160. According to the first prior art, conductive lines are cut with a laser beam for debugging.

A second prior art is disclosed in Japanese Patent application No. 58-42126 (U.S.P. No. 4,609,809). The second prior art used an ion beam emitted from a liquid metal ion source and focused in a spot of 0.5 microns or less in diameter for cutting the conductive lines, perforating and connecting the upper and lower conductive lines through deposition using the ion beam.

A third prior art is disclosed in "Direct Writing of Highly Conductive Mo Lines by Laser Induced CVD", Extended Abstract of 17th Conf. on Solid State Devices and Material, (1985) p. 193.

The first prior art relates only to means for cutting the wirings and to nothing about means for connecting the conductive lines.

The laser material processing method has disadvantages that (1) the heat generated by laser material processing is transferred by conduction to a portion surrounding a part being processed causing the evaporation and eruption of the materials, and hence it is very difficult to apply the laser material processing method to processing a minute part of 0.5 microns or less in size, and (2) application of the laser material processing method to processing a thick insulating film of 2 microns or greater in thickness is difficult, because the laser beam is hard to be absorbed by the insulating film formed of $SiO_2$ or $Si_3N_4$ and is absorbed by the wiring formed of aluminum or polycrystalline silicon under the insulating film causing the evaporation and eruption of the materials forming the wiring, which explosively blows off the insulating film covering the wiring, and laser material processing damages seriously a portion surrounding the part being processed causing faults. Accordingly, it is difficult to apply the laser material processing method to processing the wirings of multilayer interconnection and highly integrated minute wirings.

The second prior art relates to (1) means employing a focused ion beam for cutting and perforating, and (2) means employing a focused ion beam for connecting multilayer wirings. The focused ion beam material processing is capable of processing a material of 0.5 microns or less in size, and is capable of processing layers sequentially from the upper layer by sputtering regardless of type of material. Thus, the second prior art eliminates the disadvantages of the first prior art. However, the second prior art relates only to a procedure for connecting wirings formed in layers one over the other and not to means for connecting wirings arranged at different places, respectively.

According to this third prior art, a silicon substrate coated with $SiO_2$ film is irradiated by an ultraviolet laser beam in a gaseous ambient of an inorganic metal compound such as $Mo(CO)_6$ (molybdenum carbonyl) to deposit a metal such as molybdenum over the substrate through a photothermal or photochemical laser-induced CVD process for directly forming a metallic wiring pattern. However, the third prior art relates only to merely forming a wiring pattern of molybdenum over an insulating film, and to nothing about means for interconnecting wirings formed under insulating films, such as a protective film and insulating films formed between the layers of the wirings, which is an ordinary configuration of a practical IC.

SUMMARY OF THE INVENTION

An object of the present invention is to provide an IC wiring connecting method and an apparatus for carrying out the same capable of connecting wirings covered with insulating films, such as a protective film and interlaid insulating films, and wirings formed in different places, by perforating the insulating films minutely for debugging an IC, correcting faults in an IC and analyzing the faults. According to an IC wiring connecting method of the present invention, insulating films covering wirings to be connected to an IC are perforated at positions where the wirings need to be connected by means of a concentrated ion beam, and then the IC is irradiated by an energy beam such as a concentrated laser beam or an electron beam, or a concentrated ion beam in an ambient of a gaseous metal compound to connect the wirings by depositing a metal in the holes formed through the insulating films, in which the respective upper portions of the holes are enlarged to deposit an increased amount of the metal particularly in the upper portions of the holes so that the wirings formed one over the other are connected satisfactorily.

In one aspect of the present invention, an IC wiring connecting apparatus comprises a vacuum chamber, a movable IC chip supporting table disposed within the vacuum chamber, a gaseous metal compound supplying means for supplying a gaseous metal compound into the vacuum chamber, a bright ion source provided in the vacuum chamber, an electrostatic optical system provided in a container, for focusing and deflecting an ion beam emitted from the ion source to process the insulating films of an IC chip by a minute spot of a concentrated ion beam and to form conductive layers through an ion beam induced CVD process, and analyzing means including a secondary charged particle (electron) detector and a secondary ion mass spectrometer disposed near the IC supporting stage to scan the wiring patterns to obtain ion images for observation.

In another aspect of the present invention, an IC wiring connecting apparatus comprises a plurality of vacuum chambers disposed contiguously and partitioned by gate valves, an IC chip supporting stage which moves between the vacuum chambers, a laser optical system, an observation optical system, a focusing lens, said laser optical system, observation optical system and focusing lens being associated through a window with the interior of one of the vacuum chambers, a bright ion source, an electrostatic optical system for focusing and deflecting an ion beam to process insulating films of the IC by irradiating the IC by a minute spot of a concentrated ion beam, said bright ion source and electrostatic optical system being provided in the other vacuum chamber, and a secondary electron detector or the like disposed contiguously to the IC chip supporting stage to scan the wiring patterns of the IC to obtain ion images of the patterns for observation.

When necessary, the IC wiring connecting apparatus further comprises an insulating film forming means such as a sputtering apparatus or a CVD apparatus to form insulating films.

In operation, connecting points where a plurality of conductive lines of an IC are connected are searched for by detecting secondary electron signals or secondary ion signals provided by the wirings with a scanning ion microscope, then the IC chip is positioned to determine a position to be irradiated, and then the position is irradiated by an ion beam to remove part of insulating films covering the wiring, corresponding to the position to be irradiated. Since a concentrated ion beam is used instead of a laser beam, a minute part of 0.5 microns or less in size can be satisfactorily processed by a minute spot of the concentration ion beam. Since the ion beam is capable of processing films irrespective of the material forming the film, insulating films of $SiO_2$ and $Si_3N_4$ can be processed sequentially from the top to the bottom film to perforate the insulating films so that conductive lines covered with the insulating films are exposed. After the insulating films have thus been perforated, a gaseous metal compound is supplied through a pipe and a nozzle into the vacuum chamber, then the IC chip supporting stage is moved relative to the concentrated ion beam or a concentrated laser beam, and then the positions for connecting the conductive lines are irradiated by a concentrated ion beam or a concentrated laser beam to deposit the metal so as to connect the conductive lines through an ion beam induced CVD process or a laser CVD process. Thus, a finished IC is debugged, faults in the finished IC are corrected and the faults can be analyzed by correcting the internal wirings of the finished IC.

When required, an insulating film is formed over the exposed conductive lines by an insulating film forming means such as a sputtering apparatus or a CVD apparatus, and then a metallic wiring pattern is formed over the insulating film by an ion induced CVD process or a laser CVD process.

DESCRIPTION OF THE PREFERRED EMBODIMENTS

Figure 1A:
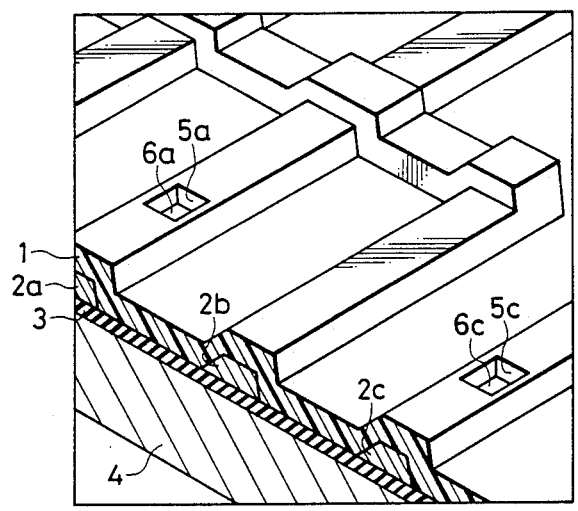
FIGS. 1(a) and 1(b) are fragmentary perspective views of assistance in explaining an IC wiring connecting method according to the present invention.
Figure 1B:
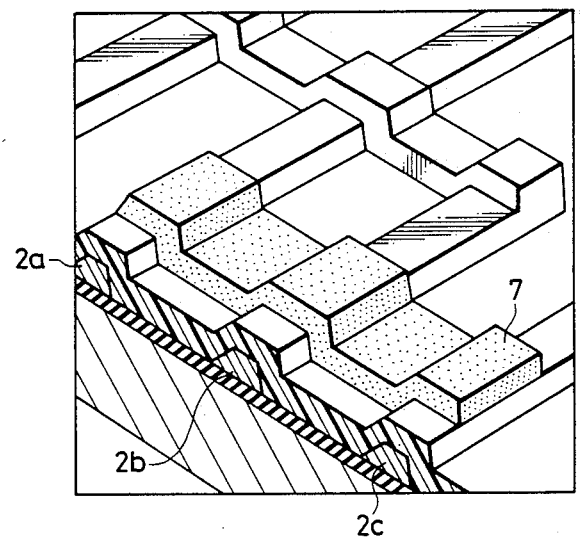

Referring to FIG. 1(a) showing an IC chip in a partly sectional perspective view, an insulating film 3 such as a $SiO_2$ film is formed over a substrate 4 such as a silicon substrate, and conductive lines 2a, 2b and 2c of a conductive material such as aluminum are formed over the insulating film 3 and are covered with a protective film 1 of $SiO_2$ or $Si_3N_4$. When the conductive lines 2a and 2c are required to be connected electrically, through holes 5a and 5c are formed in the protective film 1 at positions corresponding to the conductive lines 2a and 2c, respectively, with a concentrated ion beam to expose part 6a of the conductive line 2a and part 6c of the conductive line 2c. Then a metallic film 7 is formed between the through holes 5a and 5c as shown in FIG. 1(b) by an ion induced CVD process or a laser induced CVD process to interconnect the conductive lines 2a and 2c.

Figure 2:
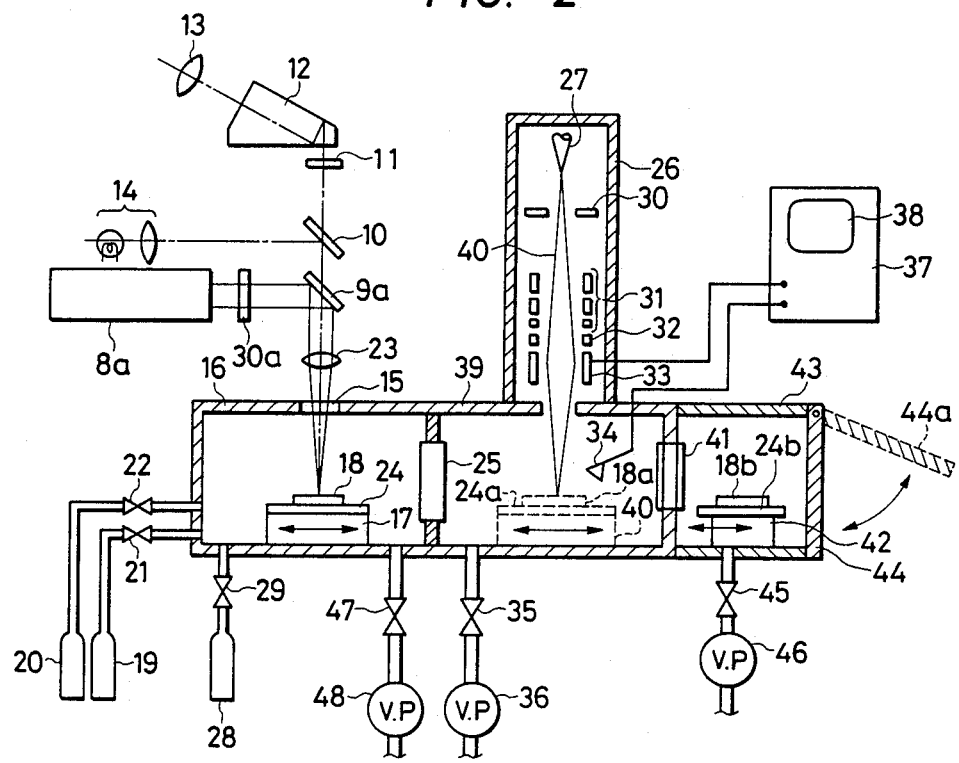
FIGS. 2, 3 and 4 are schematic side elevations of IC wiring connecting apparatus, in first, second and third embodiments, respectively, according to the present invention.

Referring to FIG. 2 showing an IC wiring connecting apparatus, in a first embodiment, according to the present invention, an IC chip 18 to be subjected to wiring connecting process is placed in a reaction chamber 16. A bomb 19 containing a correcting (repairing) substance for example
(1) Organometal compounds such as:
  (A) Metal alkyl $M(C_nH_{2n+1})_m$ such as $Al(CH_3)_3$, $Al(C_2H_5)_3$, $Al(C_4H_9)_3$, $Cd(CH_3)_2$, $Cd(C_2H_5)_2$
  (B) Metal carbonyl $Mn(CO)n$ such as $Mn(CO)_6$
  (C) Metal alcooxides $M(OC_nH_{2n+1})_m$ such as Ta-$(OC_2H_5)_5$
(2) Metal halides $MX_n$
  such as WF, WCl
  where M denotes metal element such as W, Mo, Ta, Al, Cd, Zn, Ni, Zr; X denotes halogen element such as F, Cl, Br,
a square bomb 16, a vacuum pump 48 and a bomb 28 containing an inert gas, such as Ar gas, are connected to the reaction chamber 16 through valves 21, 22, 48 and 29, respectively.

A laser beam emitted from a laser 8a is reflected by a dichroic mirror 9a, then the laser beam is concentrated by an objective lens 23, and then the concentrated laser beam is projected through a window 15 formed in the reaction chamber 16 on an IC chip 18 at a position corresponding to a portion of aluminum conductive lines to be corrected of the IC chip 18. The portion to be corrected can be observed through an observation optical system including an illuminating unit 14, a half mirror 10, a laser absorption filter 11, a prism 12 and an eye lens 13 during the correcting operation.

The IC chip 18 is attached to a stage 24 mounted on an XY table 17. A vacuum chamber 39 for ion beam processing is disposed contiguously to the reaction chamber 16. The vacuum chamber 39 and the reaction chamber 16 are partitioned by a gate valve 25. A vacuum ion beam lens barrel 26 is attached to the upper pat of the vacuum chamber 39. An XY table 40 is disposed within the vacuum chamber 39. The XY tables 17 and 40 are provided with chucking mechanisms, not shown, respectively, for chucking the stage 24. The XY tables 17 and 40 are moved near to the gate valve 25 and the gate valve 25 is opened to transfer the stage 24 from the XY table 17 to the XY table 40 or from the latter to the former. After the stage 24 carrying the IC chip 18 has been transferred from the XY table 17 to the XY table 40, the XY table 40 is moved to locate the IC chip 18 and the XY table 40 at positions indicated at 18a and 24a in FIG. 2, respectively. With the IC chip 18 and the stage 24 thus located directly below the vacuum ion beam lens barrel 26, an ion beam 40 induced from a bright ion source 27, such as a liquid gallium ion source, contained in the vacuum ion beam lens barrel 26 by an inducing electrode 30 disposed below the bright ion source 27 is concentrated and deflected through an electrostatic lenses 31, a blanking electrode 32 and a deflecting electrode 33, and falls on the IC chip 18. A secondary charged particle detector 34 is disposed within the vacuum container 39. A secondary particle signal produced by the IC chip 18a is amplified in synchronism with a deflecting signal produced by a power source 37 for the deflecting electrode, and an enlarged image of the IC chip 18 magnified by a scanning ion microscope is displayed on a monitor 38 for inspecting and positioning the IC chip 18. A vacuum pump 36 is connected through a valve 35 to the vacuum chamber 39 to evacuate the vacuum chamber 39. A preparatory vacuum chamber 43 for receiving an IC chip is joined to the vacuum chamber 39 with a gate valve 41 therebetween. The gate valve 41 is opened to transfer the stage 24 carrying the IC 18 from the XY table 40 to a movable table 42, as indicated at 18b and 24b in FIG. 2. An exhaust pump 46 is connected through a valve 45 to the preparatory vacuum chamber 43 to evacuate the preparatory vacuum chamber 43. A gate 44 is opened to a position 44a to put an IC chip into or to remove an IC chip from the preparatory vacuum chamber 43.

The manner of operation of the IC wiring connecting apparatus thus constituted will be described hereinafter.

The IC chip 18 is placed at the position 18b on the stage 24 mounted at the position 24b on the movable table 42. Then, the gate 44 is closed, the valve 45 is opened and and a deflecting electrode 33, and falls on the IC chip 18. A secondary charged particle detector 34 is disposed within the vacuum container 39. A secondary particle signal produced by the IC chip 18a is amplified in synchronism with a deflecting signal produced by a power source 37 for the deflecting electrode, and an enlarged image of the IC chip 18 magnified by a scanning ion microscope is displayed by a monitor 38 for inspecting and positioning the IC chip 18. A vacuum pump 36 is connected through a valve 35 to the vacuum chamber 39 to evacuate the vacuum chamber 39. A preparatory vacuum chamber 43 for receiving an IC chip is joined to the vacuum chamber 39 with a gate valve 41 therebetween. The gate valve 41 is opened to transfer the stage 24 carrying the IC 18 from the XY table 40 to a movable table 42, as indicated at 18b and 24b in FIG. 2. An exhaust pump 46 is connected through a valve 45 to the preparatory vacuum chamber 43 to evacuate the preparatory vacuum chamber 43. A gate 44 is opened to a position 44a to put an IC chip into or to remove an IC chip from the preparatory vacuum chamber 43.

The manner of operation of the IC wiring connecting apparatus thus constituted will be described hereinafter.

The IC chip 18 is placed at the position 18b on the stage 24 mounted at the position 24b on the movable table 42. Then, the gate 44 is closed, the valve 45 is opened and the exhaust pump 46 is actuated to evacuate the preparatory vacuum chamber 43 to a vacuum. Then, the gate valve 41 is opened and the stage 24 is transferred from the movable table 42 to the XY table 40 to locate the stage 24 at the position 24a. Then, the gate valve 41 is closed and the vacuum chamber 39 is evacuated to a high vacuum. Then, the XY table 40 is moved and the ion beam is concentrated on the IC chip 18 to display the scanned ion image of the IC chip 18 on the monitor 38. The scanned ion image of the IC chip 18 is inspected to find parts to be interconnected. After finding the parts to be interconnected, the ion beam is projected only on the parts to be connected to remove portions of the insulating film covering the parts to be interconnected in a state as illustrated in FIG. 1. After removing the portions of the insulating film, the gate valve 25 is opened to transfer the stage 24 from the XY table 40 to the XY table 17.

The XY table 17 is operated to locate the IC chip 18 so that a wiring correcting part where a conductive line for correcting the wiring is to be formed is located at an irradiating position where the wiring correcting part is irradiated by the laser beam. Then, the valves 21 and 29 are opened to supply the correcting substance and the inert gas into the reaction container 16 in an appropriate mixing ratio. The respective flow rates of the correcting substance and the inert gas are regulated on the basis of indications on flow meters, not shown, The valve 47 is regulated to adjust the total pressure within the reaction chamber 16 to a value in the range of several tens to several hundreds Torrs. Then, the shutter 30a is opened to irradiate the wiring correcting parts by the laser beam for a fixed period of time, and then the shutter 30a is closed. When irradiated by the laser beam, the gaseous inorganic metal surrounding the wiring correcting part is decomposed and aluminum, cadmium or molybdenum deposits in a metal film to form a conductive line for correcting the wiring. Thus, all the wiring correcting parts are corrected. After all the wiring correcting parts has been thus corrected, the valve 47 is opened to evacuate the reaction chamber 16, then the IC chip 18 is transferred through the vacuum chamber 39 to the preparatory vacuum chamber 43, and then the IC chip is taken out. Since the reaction chamber 16 for the laser induced CVD process and the vacuum chamber 39 for the ion beam perforating process are joined together in a single container, the IC chip need not be taken out into the atmosphere after being subjected to the ion beam perforating process before the laser induced CVD process, and hence the exposed conductive lines are not oxidized. Therefore, the conductive lines of the IC and the conductive lines formed by the laser induced CVD process are bonded together satisfactorily.

Figure 3:
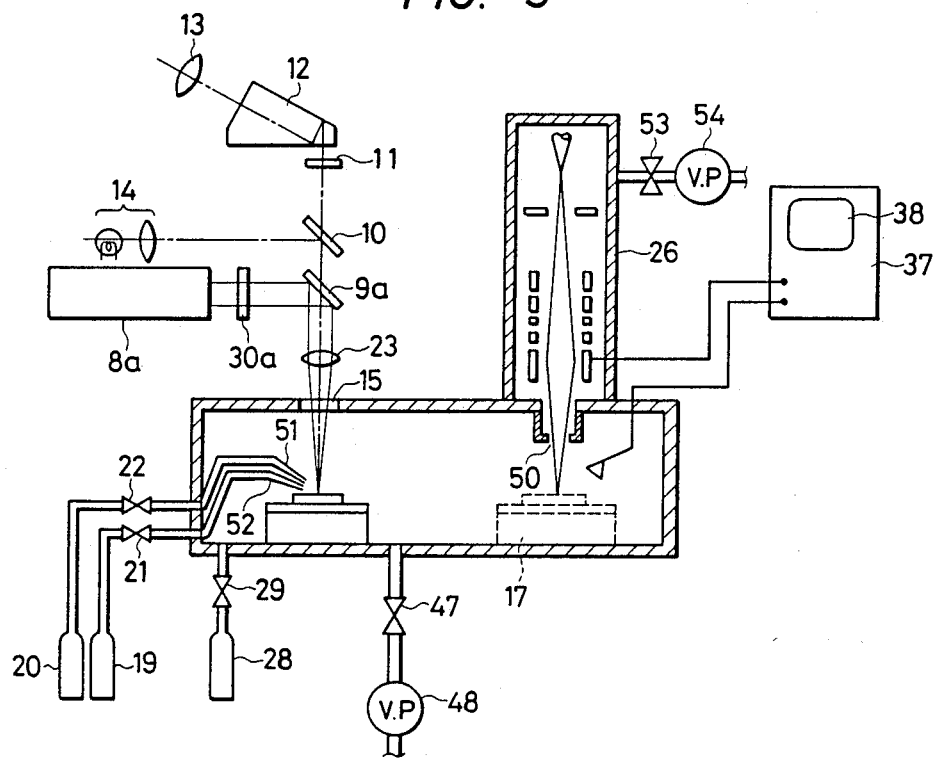

Referring to FIG. 3, an IC wiring connecting apparatus, in a second embodiment, according to the present invention has a single vacuum chamber having a first section for the ion beam perforating process and a second section for the laser induced CVD process. Any gate valve is not provided between the first section and the second section. Accordingly, in the second embodiment, only a single vacuum chamber needs to be evacuated for IC wiring connecting operation and any gate valve need not be operated for transferring the IC chip between the two sections, which improves the accessibility of the apparatus. If the gaseous correcting substance prevails also in the first section of the vacuum chamber, the ion beam lens barrel will become dirty. To prevent the ion beam lens barrel from becoming dirty, the gaseous correcting substance is blown against the IC chip from nozzles 51 and 52 disposed near the IC chip so that the gaseous correcting substance will prevail locally only around the IC chip, only a narrow orifice for passing the ion beam is formed in a wall separating the vacuum chamber and the ion beam lens barrel, and the ion beam lens barrel is evacuated by an evacuating unit comprising a valve 53 and a vacuum pump 54.

Figure 4:
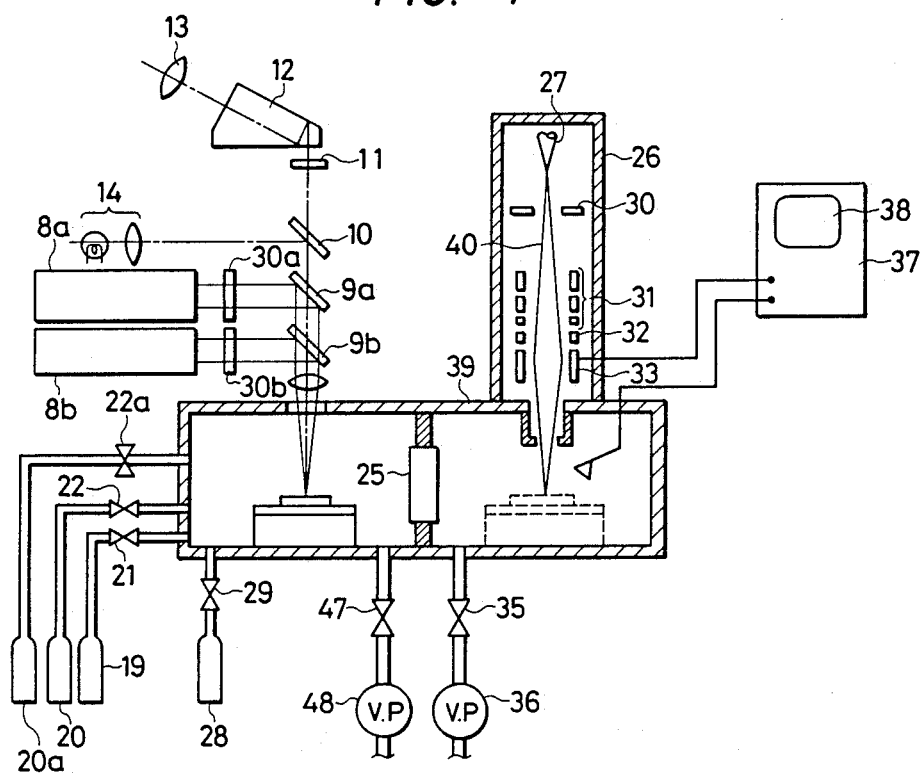

Referring to FIG. 4, an IC wiring connecting apparatus, in a third embodiment, according to the present invention comprises two lasers, namely, a first laser 8a combined with a half mirror 9a, and a second laser 8b combined with a dichroic mirror 9b.

When a conductive metallic line, for example, the metallic film 7 shown in FIG. 1(a), formed through the foregoing processes to interconnect the conductive lines of an IC for wiring correction is exposed, it is possible that many problems occur in the characteristics and reliability of the IC chip. Accordingly, the conductive metallic line must be covered with a protective film. To form the protective film, the second laser 8b which generates argon laser third harmonic is provided in addition to the first laser 8a which generates argon laser second harmonic. In forming the protective film over the conductive metallic line, $Si_2H_6$ gas and $N_2O$ gas are supplied from bombs 20 and 20a, respectively, into the vacuum chamber, and then the argon laser third harmonic is focused on the conductive metallic line to cover the conductive metallic line with a $SiO_2$ film. The two lasers may be substituted by one argon laser comprising a changeover mirror, a crystal for second harmonic and a crystal for third harmonic, and the crystal for second harmonic and the crystal for third harmonic may be used alternately for forming a conductive metallic line and a protective film, respectively.

A conductive line of an upper wiring plane and a conductive line of an lower wiring place can be interconnected by processing the conductive line of the lower wiring plane with the second laser 8b of a large capacity so as to make part of the conductive line of the lower wiring plane erupt into a through hole formed by means of the ion beam.

Figure 5A:
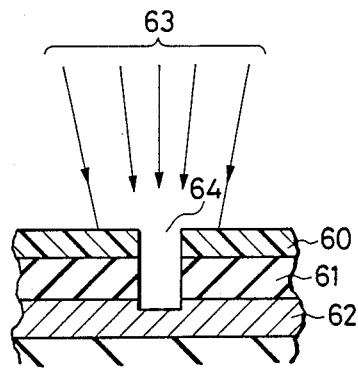
FIGS. 5(a) to 5(f), 6(a) to 6(e), 7(a) to 7(c), and 8(a) to 8(e) are fragmentary sectional views of IC chips of assistance in explaining processing for forming a wiring pattern and processes for connecting upper and lower wirings, according to the present invention.
Figure 5B:
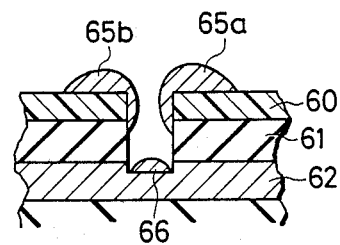
Figure 5C:
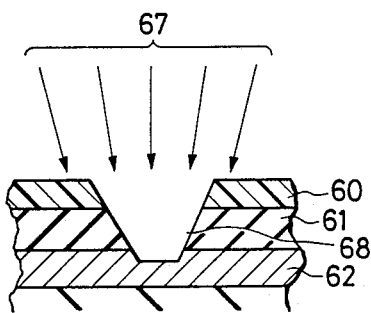
Figure 5D:
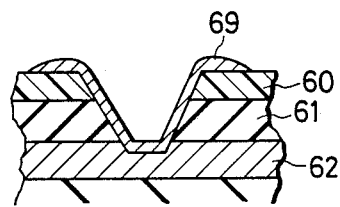
Figure 5E:
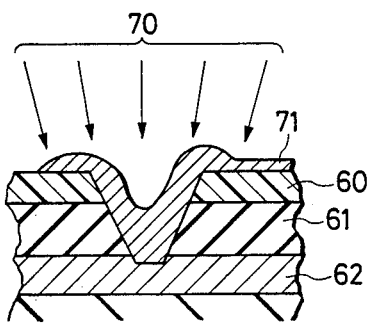
Figure 5F:
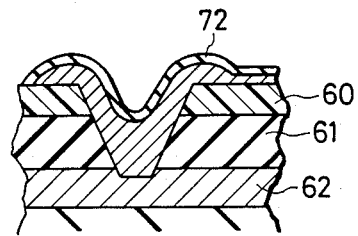

FIGS. 5(a) and 5(f) illustrates processes for interconnecting a conductive line of an upper wiring plane and a conductive line of a lower wiring plane.

When the conductive line 62 of the lower wiring plane is formed of aluminum, normally, the conductive line 62 is covered with thick layers of a protective film 60 and an insulating film 61. In such a case, when the protective film 60 and the insulating film 61 are perforated by means of an ion beam or a laser beam in a straight hole having a large depth as compared to the diameter as shown in FIG. 5(a), the end 65a, 65b, 66 of a connecting line is liable to be discontinuous as shown in FIG. 5(b), because the ion beam or the laser beam hardly reaches the depth of the hole, the organic metal gas is unable to flow smoothly into the hole, and the metal deposited around the edge of the hole impede the entrance of the ion beam or the laser beam into the hole.

To prevent such troubles, in perforating the protective film 60 and the insulating film 61 by the ion beam perforating process, the sweeping width of the ion beam is varied to form a taper hole tapering downward as shown in FIG. 5(c). The taper hole overcomes the disadvantages of the straight hole and allows a continuous metallic film 69 to be formed over the surface of the taper hole as shown in FIG. 5(d) by means of a laser beam or an ion beam 67. Then, a conductive line 71 is formed by means of a laser beam or an ion beam 70 in a state as shown in FIG. 5(e). Then, an protective insulating film 72 is formed over the conductive line 71 and the metal deposited in the taper hole as shown in FIG. 5(f) by a process as explained with reference to FIG. 4.

FIGS. 6(a) to 6(e) illustrate another process for interconnecting a conductive line of a lower wiring plane and a conductive line formed at a separate position. This IC chip is of a two-layer construction having a conductive line 81 formed of aluminum in a lower wiring plane and a conductive line 80 formed on aluminum in an upper wiring plane. When the foregoing process is employed, the conductive line 81 of the lower wiring plane is connected to the conductive line 80 of the upper wiring plane by a conductive line 82 as shown in FIG. 6(i a).

Figure 6A:
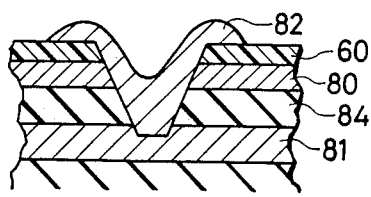
Figure 6B:
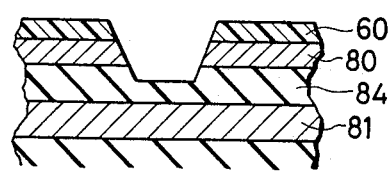
Figure 6C:
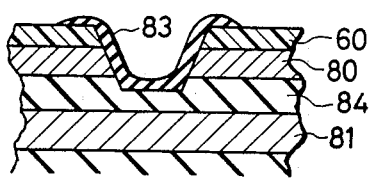
Figure 6D:
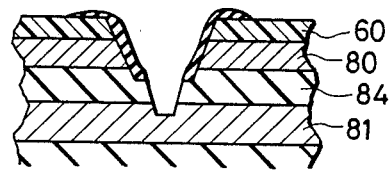
Figure 6E:
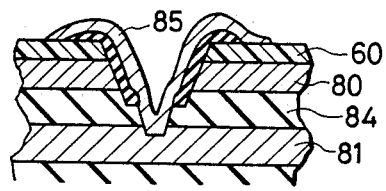

Accordingly, to connect the conductive line 81 of the lower wiring plane to a conductive line formed at a separate position, a taper hole is formed through a protective film 60 and the conductive line 80 of the upper wiring plane by means of an ion beam in a state as shown in FIG. 6(b), then an insulating film 83, such as a $SiO_2$ film is formed over the surface of the taper hole in a state as shown in FIG. 6(c) by the foregoing process, then a hole is formed through the insulating film 83 and an intermediate insulating film 84 to expose the conductive line 81 of the lower wiring plane as shown in FIG. 6(d), and then a conductive line 85 is formed by the laser or ion beam induced CVD process to connect the conductive line 81 of the lower wiring plane to a conductive line formed at a separate position as shown in FIG. 6(e).

FIGS. 7(a) to 7(c) and 8(a) to 8(e) illustrate further IC wiring connecting methods according to the present invention, for interconnecting a conductive line of an upper wiring plane and a conductive line of a lower wiring plane formed at the same position.

Figure 7A:
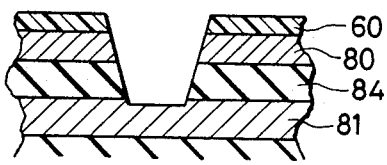
Figure 7B:
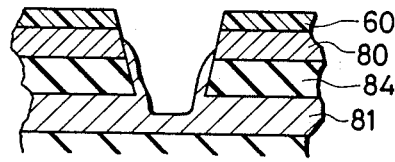
Figure 7C:
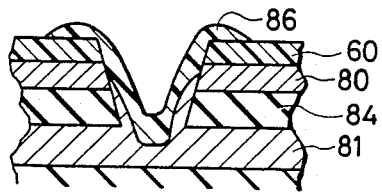

In the method illustrated in FIGS. 7(a) to 7(c), a hole is formed through layers superposed on a conductive line 81 of a lower wiring plane formed of aluminum by means of an ion beam to expose the conductive line 81 (FIG. 7(a)), then, the conductive line 81 is processed by a laser beam so that part of the conductive line fuses and sputters connecting the conductive line 81 of the lower wiring plane to a conductive line 80 of an upper wiring plane (FIG. 7(b)), and then a protective film 86, such as a $SiO_2$ film, is formed over the interconnected part by the laser or ion beam induced CVD process (FIG. 7(c)).

The method illustrated in FIGS. 8(a) to 8(e) is a practical application of an ion beam material processing technique published in "Characteristics of Silicon Removal by Fine Focussed Gallium Ion Beam", J. Vac. Sci. Technol B 3 (1) pp. 71–74 (Jan./Feb. 1985).

According to this ion beam material processing technique, the result of process is dependent on the repetitive processing conditions. That is, (1) when an ion beam is reciprocated repeatedly at a high frequency, the material is less liable to sputter, and (2) when an ion beam is reciprocated repeatedly by less times at a low frequency, the material is more liable to sputter.

Figure 8A:
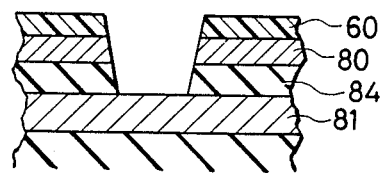
Figure 8B:
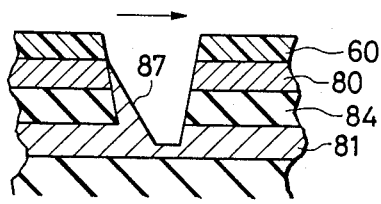
Figure 8C:
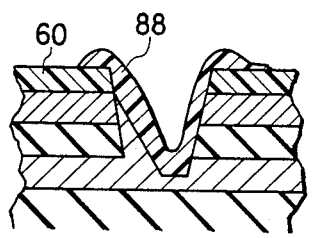
Figure 8D:
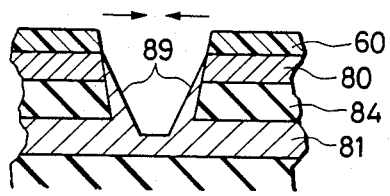
Figure 8E:
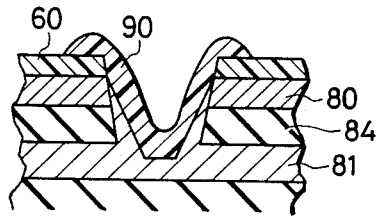

In this method, a hole is formed through layers superposed on a conductive line 81 of a lower wiring plane by a concentrated ion beam to expose the conductive line 81 in conditions meeting the conditions of item (1) (FIG. 8(a)), Then, the concentrated ion beam is moved in a direction indicated by an arrow as the ion beam is reciprocated in directions perpendicular to the sheet to process the conductive line 81 in conditions meeting the conditions of item (2) so that the material forming the conductive line 81 sputters and adheres to one side of the surface of the hole in a film 87 (FIG. 8(b)) or the concentrated ion beam is moved in both directions indicated by arrows as the ion beam is reciprocated at a low frequency in directions perpendicular to the sheet in conditions meeting the conditions of item (2) so that the material forming the conductive line 81 sputters and adheres to both the sides of the surface of the hole in films 89 (FIG. 8(d)). Thus, the conductive line 81 of the lower wiring plane and the conductive line 80 of the upper wiring plane can be interconnected by either method. After the conductive line 81 of the lower wiring plane and the conductive line 80 of the upper wiring plane have been interconnected, protective films 88 and 90, such as $SiO_2$ films, are formed by the laser or ion beam induced CVD process.

It is also possible to interconnect the respective conductive lines 80 and 81 of separate wiring planes at the same position by making a hole through the conductive line 80 of the upper wiring plane and the protective film 84, and then by depositing a metal in the hole by the laser or ion beam induced CVD process, which is apparent from the foregoing description of the present invention.

The material for forming the film interconnecting conductive lines by the laser or ion beam induced CVD process is not necessarily limited to a metal compound; the material may be of any kind as far as the material is able to form a conductive film.

The energy beam for the CVD process is not limited to a laser beam or an ion beam; it is possible to use an electron beam for the CVD process.

Any other energy beam capable of forming a submicron hole may be used instead of the concentrated ion beam for forming a hole.

Figure 9:
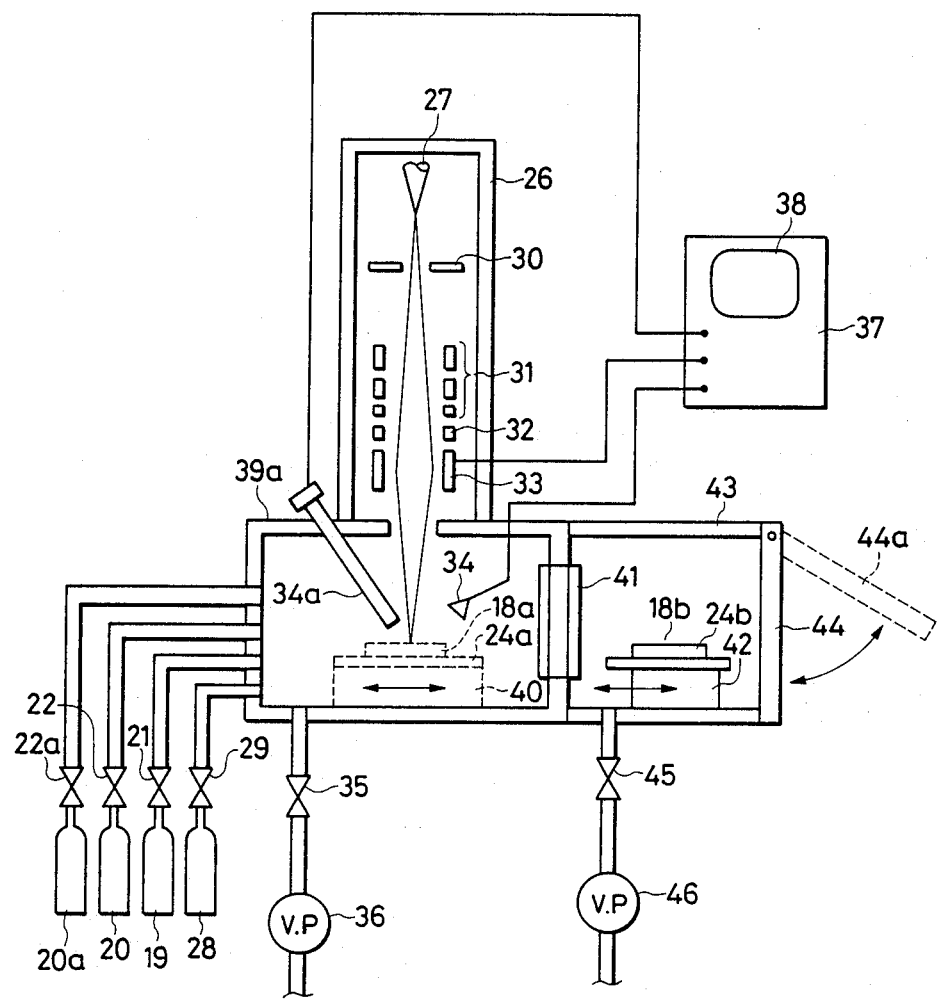
FIGS. 9 and 10 are schematic sectional views of IC wiring connecting apparatus, in fourth and fifth embodiments, respectively, according to the present invention.

FIG. 9 shows an IC wiring connecting apparatus, in a fourth embodiment, according to the present invention.

An IC chip 18a to be processed is placed within a reaction chamber 39a. A bomb 19 containing a correcting substance for example
(1) Organometal compounds such as:
  (A) Metal alkyl $M(C_nH_{2n+1})_m$ such as $Al(CH_3)_3, Al(C_2H_5)_3, Al(C_4H_9)_3, Cd(CH_3)_2, Cd(C_2H_5)_2$
  (B) Metal carbonyl $M(CO)_n$ such as $Mn(CO)_6$
  (C) Metal alcooxides $M(OC_nH_{2n+1})_m$ such as $Ta(OC_2H_5)_5$
(2) Metal halides $M_{x_n}$
  such as WF, WCl
  where M denotes metal element such as W, Mo, Ta, Al, Cd, Zn, Ni, Zr; X denotes halogen element such as F, Cl, Br,
a vacuum pump 36 and a bomb 28 containing an inert gas are connected through valves 21, 35 and 29, respectively, to the reaction chamber 39a. A spare bomb 20 is connected through a valve 22 to the reaction chamber 39a. The IC chip 18a is secured to a stage 24a mounted on an XY table 40. A vacuum ion beam lens barrel 26 is attached to the upper wall of the reaction chamber 39a.

An ion beam induced by an inducing electrode 30 from a bright ion source, such as a liquid metal ion source, for example, a liquid gallium ion source, is concentrated and deflected by electrostatic lenses 31, a blanking electrode 32 and a deflector 33, and is focused on the IC ship 18a. A secondary electro detector 34 and a secondary ion mass analyzing tube 34a are disposed within the reaction chamber 39a to amplify a secondary electron signal or a secondary ion current transmitted from the IC chip 18a in synchronism with a deflection signal provided by a power source 37 for the deflecting electrode and to display a scanned ion microscopic image of the IC chip 18a on a monitor 38 for inspecting and positioning the IC chip 18a. A vacuum pump 36 is connected through a valve 35 to the reaction chamber 39a to evacuate the reaction chamber 39a. A preparatory vacuum chamber 43 for receiving an IC chip is joined to the reaction chamber 39a. The reaction chamber 39a and the preparatory vacuum chamber 43 are partitioned by a gate valve 41. The gate valve 41 is opened to transfer the stage 24a mounted with the IC chip 18a from the XY table 40 to a movable table 42 as indicated at positions 24b and 18b. A vacuum pump 46 is connected through a valve 45 to the preparatory vacuum chamber 43 to evacuate the preparatory vacuum chamber 43. A gate 44 is opened to a position 44a to put an IC chip into or to take out the IC chip from the preparatory vacuum chamber 43.

The manner of operation of this IC wiring connecting apparatus will be described hereinafter. The gate 44 is opened and an IC chip 18a is placed at the position 18b on the stage 24a located at the position 24b on the movable table 42. Then the gate 44 is closed, the valve 45 is opened and the vacuum pump 46 is actuated to evacuate the preparatory vacuum chamber 43 to a vacuum. Then, the gate valve 41 is opened and the stage 24a is transferred from the movable table 42 to the XY table 40. After closing the gate valve 41, the reaction chamber 39a is evacuated to a high vacuum. Then, an ion beam is focused on the IC chip 18a, while the XY table is operated to observe the scanned ion microscopic image to find positions where the conductive lines are to be interconnected. Then, an ion beam is focused at the positions corresponding to conductive lines to be interconnected to form holes through the insulating film as illustrated in FIG. 1(a). After the holes have been formed, the valves 21 and 29 are opened to supply the correcting substance and the inert gas into the reaction chamber 39a in a suitable mixing ratio. The respective flow rates of the correcting substance and the inert gas are regulated on the basis of indications on flow meters, not shown. The degree of opening of the valve 35 is adjusted so that the total pressure within the reaction chamber 39a is in the range of several tens to several hundreds Torrs. Then, the positions where the conductive lines are interconnected are irradiated by an ion beam to decompose the correcting substance, namely, a gaseous inorganic metal compound, prevailing around the irradiated positions, whereby a metal, such as aluminum, cadmium or molybdenum, is deposited in a conductive film to interconnect the conductive lines for correcting the wiring of the IC chip 18a. After all the portions of the wiring of the IC chip to be corrected have been corrected, the valve 35 is opened to exhaust the gases from the reaction chamber 39a, then the IC chip 18a is transferred from the reaction chamber 39a to the preparatory vacuum chamber, and then the IC chip 18a is taken out.

Figure 10:
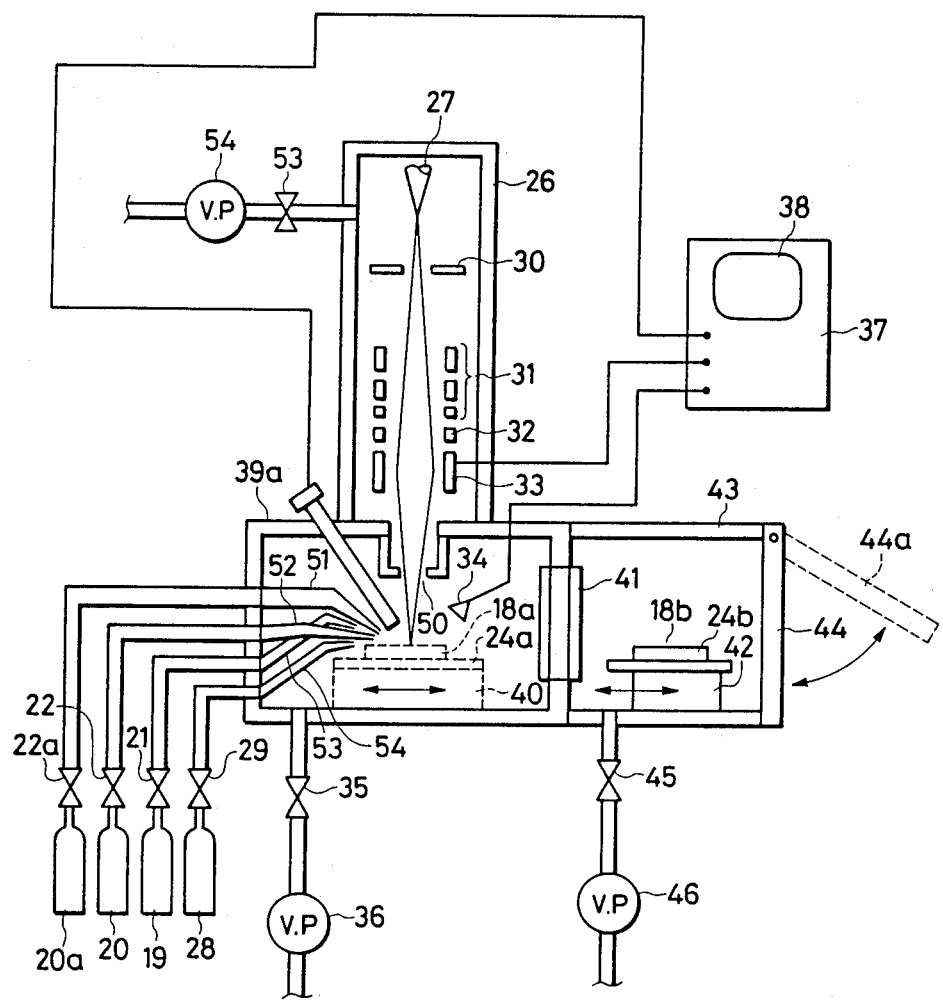

FIG. 10 shows an IC wiring connecting apparatus, in a fifth embodiment, according to the present invention.

In this IC wiring connecting apparatus, a correcting substance is blown locally only around the IC chip from nozzles 51 and 52, only a narrow orifice for passing the ion beam is formed below the ion beam lens barrel 26 in the upper wall of the reaction chamber 39a, and the ion beam lens barrel 26 is evacuated by an evacuating unit including a valve 53 and a vacuum pump 54, to prevent the ion beam lens barrel 26 from becoming dirty.

As mentioned above, when the conductive film interconnecting the conductive lines of the IC chip is exposed as shown in FIG 1(b), it is possible that problems occur in the characteristics and reliability of the IC chip. Therefore, the conductive film must be covered with a protective film. A process similar to the process for forming the conductive film is performed to form a protective film over the conductive film. To form such a protective film, $Si_2H_6$ gas and $N_2O$ gas are supplied from bombs 20 and 20a, respectively, into the reaction chamber 39a, and the gases are blown against the IC chip through nozzles, while the conductive film is irradiated by a concentrated ion beam to form a protective film of $SiO_2$ over the conductive film by the ion beam induced CVD process.

It is obvious that the ion beam is effective for the CVD process as well as the laser beam.

Figure 11:
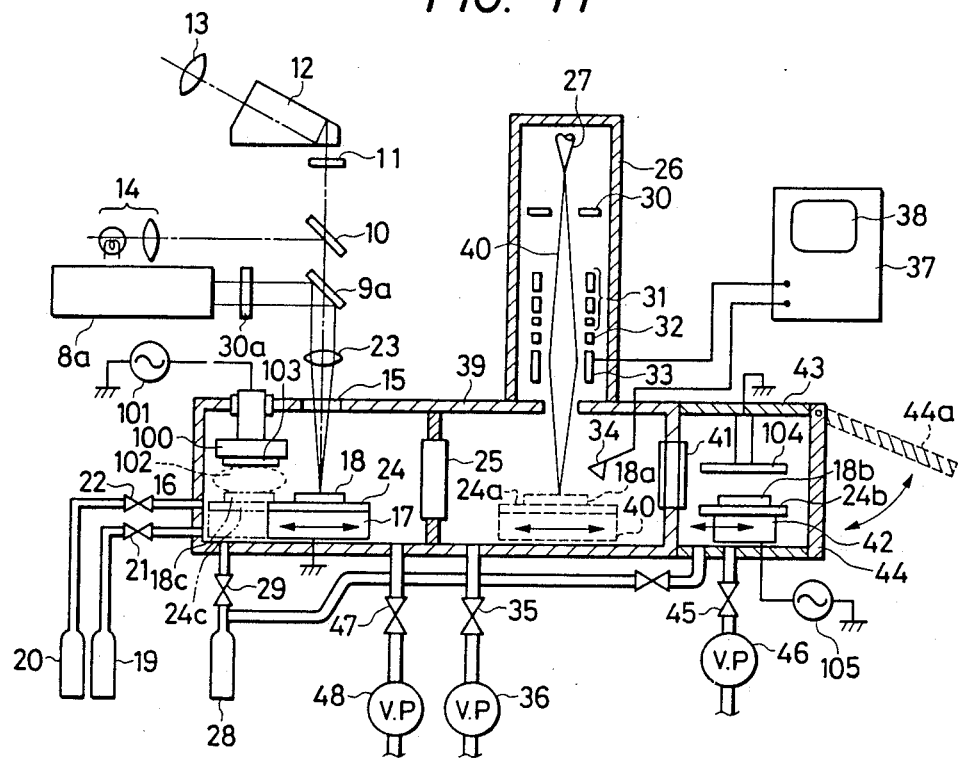
FIGS. 11, 12, and 13(a) and 13(b) are schematic illustrations of IC wiring connecting apparatus, in sixth, seventh and eighth embodiments, according to the present invention.

FIG. 11 shows an IC wiring connecting apparatus, in a sixth embodiment, according to the present invention, which is similar to the IC wiring connecting apparatus of FIG. 2. In FIG. 11, parts like or corresponding to those previously described with reference to FIG. 2 are denoted by the same reference numeral or characters, and the sixth embodiment will be described only with reference to points which are different from those of the first embodiment shown in FIG. 2.

A sputtering electrode 100 is disposed within a reaction chamber 16 adjacent to a position where an IC chip 18 is subjected to laser beam irradiation. The sputtering electrode 100 is connected to a high frequency power source 101. A stage 24 can be located at a position 18c directly below the sputtering electrode 100. The stage 24 is grounded for high frequency discharge 102 between the sputtering electrode 100 and an IC chip mounted on the stage 24. An insulating target piece 103 is attached to the sputtering electrode 100 to form an insulating film over the IC chip 18 located at the position 18c through high frequency discharge.

A sputter etching electrode 104 is disposed within a preparatory vacuum chamber 43, and is grounded. The stage 24 when located at a position 24b in the preparatory vacuum chamber 43 is electrically isolated from the preparatory vacuum chamber 43, and is connected to a high frequency power source 105. An inert gas is supplied through a valve 106 into the preparatory vacuum chamber 43 to form the plasma of the inert gas between the electrode 104 and the stage 24 by discharge. Since the stage 24 serves as an electrode to which a high frequency power is supplied, the IC chip mounted on the stage 24 is subjected to the impact of the ions of the inert gas for sputter etching.

The manner of operation of this IC wiring connecting apparatus will be described hereinafter.

Figure 14A:
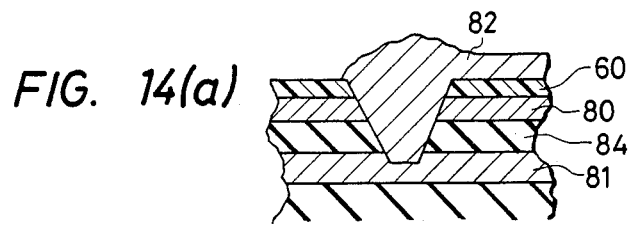
FIGS. 14(a) to 14(f) are sectional views of assistance in explaining processes of perforating wiring planes, forming an insulating film over the upper conductive line, connecting the upper and lower conductive lines and removing an insulating film by means of the IC wiring connecting apparatus of FIGS. 11, 12, and 13(a) and 13(b).
Figure 14B:
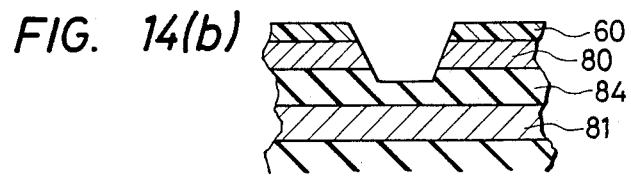

A gate 44 is opened and an IC chip 18 is placed at the position 18b on the stage 24 placed at the position 24b on a table 42. Then, the gate 44 is closed, the valve 45 is opened and the vacuum pump 46 is actuated to evacuate the preparatory vacuum chamber 43 to a vacuum. Then, a gate valve 41 is opened to transfer the stage 24 from the position 24b to a position 24a in a vacuum chamber 39. After closing the gate valve 41, the vacuum chamber 39 is evacuated to a high vacuum. Then, an ion beam is focused on the IC chip 18, while a table 40 is operated to observe a scanned ion image of the IC chip on a monitor 38 to find positions in the wiring of the IC chip 18 where the conductive lines are to be interconnected. Then, only the position where the conductive line 80 is to be connected to another conductive line is irradiated by an ion beam to form a hole through a protective film 60 and the conductive line 80 and into part of an intermediate insulating film 84 as shown in FIG. 14(b). Holes are formed at the rest of the positions for connection through the same process.

Figure 14C:
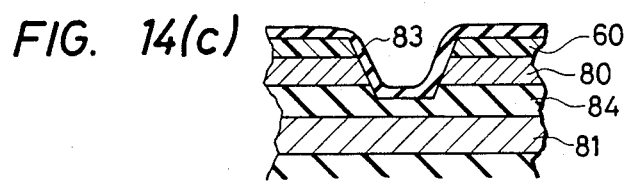

After the hole or holes have been formed, the stage 24 mounted with the IC chip 18 is transferred to the reaction chamber 16, and then the valve 29 is opened to supply an inert gas, such as argon gas, into the reaction chamber, while the reaction chamber is being evacuated by a vacuum pump 48. A valve 47 is adjusted to get the pressure within the reaction chamber 16 at a value suitable for discharging ($10^{-2}$ to $10^{-1}$ Torrs). Then, power is supplied to the electrode 100 from the high frequency power source 101 to form a $SiO_2$ film on the IC chip 18 in a state as shown in FIG. 14(c) by sputtering the target piece 103 by argon ions through plasma discharge.

Figure 14D:
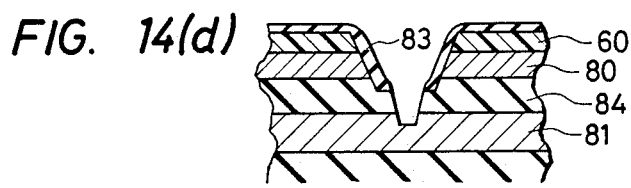

Then, the stage 24 mounted with the IC chip 18 is transferred through a gate valve 25 from the reaction chamber 16 to the vacuum chamber 39, and is located again at the position 24a. Then the IC chip 18 is irradiated by an ion beam at the position or for connection in the foregoing procedure to expose a conductive line 81 of a lower wiring plane as shown in FIG. 14(d). The rest of the positions for connection are subjected to the same process. Then, the stage 24 is transferred through the gate valve 25 from the vacuum chamber to the reaction chamber 16, and is located directly below a window 15 through which a laser beam travels onto the IC chip 18.

Then, an XY table 17 mounted with the stage 24 is adjusted to position the hole for connection at a position where the IC chip 18 is to be irradiated by a laser beam. Then, valves 21 and 29 are opened to supply the correcting substance and the inert gas into the reaction chamber 16 by adjusting the respective flow rate of the correcting substance and the inert gas on the basis of indications on flow meters, not shown, so as to mix the correcting substance and the inert gas in a suitable mixing ratio, while the valve 47 is regulated to maintain the total pressure within the reaction chamber at a value in the range of several tens to several hundreds Torr. Then, a shutter 30a is opened to irradiate the position for correction by a laser beam for a fixed period of time, and then the shutter 30a is closed. Thus, the correcting gas, namely, a gaseous inorganic metal compound, prevailing around the position for correction is decomposed and a metal, such as aluminum, cadmium or molybdenum, is deposited in a conductive film for correcting the wiring. The rest of the positions of the wiring to be corrected are subjected to the same process. Then, after completely pumping out the gas from the reaction chamber 16, the IC chip 18 is transferred from the reaction chamber 16 through the vacuum chamber 39 to the preparatory vacuum chamber 43.

Figure 14E:
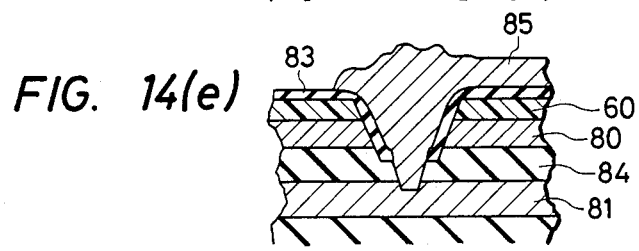
Figure 14F:
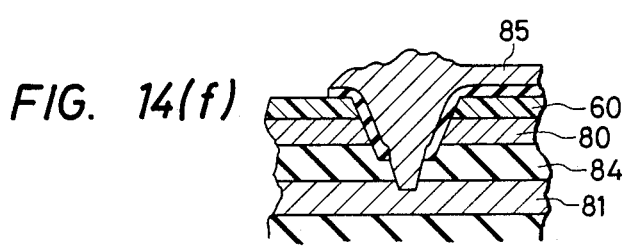

Then, the inert gas is supplied into the preparatory vacuum chamber 43, while the vacuum pump 46 is operated and the degree of opening of the valve 45 is adjusted to maintain the pressure within the preparatory vacuum chamber at a value suitable for sputter etching process. Then, power is supplied from the high frequency power source 105 to the stage 24 to form plasma for sputter etching the surface of the IC chip 18 so that an unnecessary portion of the insulating film 83 (FIG. 14(e)) is removed in a state as shown in FIG. 14(f).

By sputtering process or by plasma CVD process, an insulating layer is deposited all over the IC surface. Thus, the pads or the solder bumps, which are the external signal output terminals or are the power supply terminals, are also covered by insulating material. The insulating material on the pads or on the solder bumps must be taken away for proper IC function.

The depth of sputter etching for removing the insulating film 83 is on the order of 0.1 microns. Since the thickness of the conductive film 85 formed by the CVD process is on the order of 0.5 microns, the thickness of the conductive film 85 may be reduced to a value on the order of 0.4 microns by sputter etching, which is not any problem with the IC chip 18.

The essential functions required of an IC wiring connecting apparatus for carrying out the IC wiring connecting method are those for the ion beam process, the insulating film forming process, the conductive film forming process, and the insulating film etching process.

Deposition of insulating material is carried out not only by sputtering but also plasma CVD. For plasma CVD, FIG. 11 is modified as follows: (1) Gases appropriate for forming $SiO_2$ or $Si_3N_4$ must be supplied instead of inert gas. (2) Target 103 must be eliminated so that the high frequency powered electrode 100 is disposed directly to the CVD gases. (3) Appropriate pressure is about 1 Torr. Accordingly, the present invention may be embodied in the following apparatus.

Figure 12:
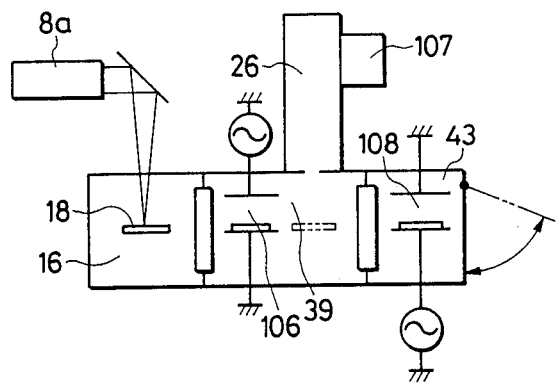

FIG. 12 shows an IC wiring connecting apparatus, in a seventh embodiment, according to the present invention.

This IC wiring connecting apparatus, similarly to that of FIG. 11, forms an insulating film by the sputtering process. In this apparatus, a sputtering mechanism 106 is disposed within a vacuum chamber 39 for ion beam material processing. This arrangement requires an additional differential evacuating system to maintain the pressure within the ion beam lens barrel 26 at a value on the order of $10^{-7}$ Torrs during the sputtering process for forming an insulating film, while the pressure within the vacuum chamber 39 is $10^{-2}$ Torr or above. Since the sputtering process for forming the insulating film is carried out in the vacuum chamber 39 instead of the reaction chamber 16 which is contaminated during the CVD process, the quality of the insulating film thus formed is improved. A sputter etching mechanism 108 is disposed within the preparatory vacuum chamber 43.

Figure 13A:
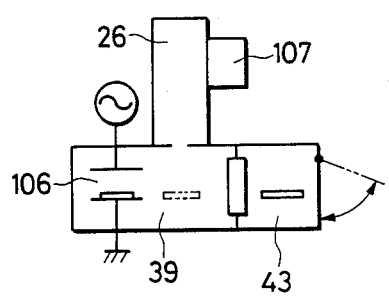
Figure 13B:
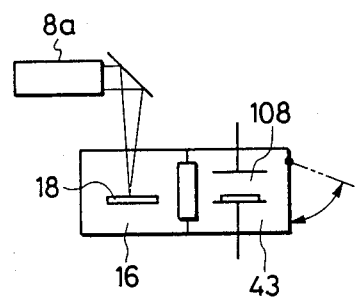

FIG. 13(a) and 13(b) shown an IC wiring connecting apparatus, in an eighth embodiment, according to the present invention.

This IC wiring connecting apparatus comprises an ion beam material processing unit (FIG. 13(a)) and a laser CVD unit (FIG. 13(b)), which are arranged separately. The ion beam material processing unit comprises an ion beam lens column 26, a differential evacuating system 107 for the ion beam lens column 26, a vacuum chamber 39, and a sputtering mechanism 106 disposed within the vacuum chamber 39. A preparatory vacuum chamber 43 is joined to the vacuum chamber 39. The laser CVD unit (FIG. 13(b)) comprises a reaction chamber 16, a preparatory vacuum chamber 47 joined to the reaction chamber 16, a sputter etching mechanism 108 disposed within the preparatory vacuum chamber 47, and a laser 8a.

In operation, after a conductive line 81 of a lower wiring plane has been exposed through the ion beam material processing in the vacuum chamber 39, the IC chip is taken out from the vacuum chamber 39, so that the exposed conductive line 81 is oxidized and an oxide film of one to two nanometers in thickness is formed over the exposed conductive line 81. Therefore, the oxide film is removed by the sputter etching mechanism 108 before subjecting the IC chip to the laser CVD process in the reaction chamber 16.

Although the separation of the laser CVD unit and the ion beam material processing unit requires more floor space for installing the IC wiring connecting apparatus, the individual units are simplified in construction, and hence the reliability of the IC wiring connecting apparatus is improved.

As apparent from the foregoing description, according to the present invention, conductive lines formed at separate positions, respectively, in a large-scale multilayer IC chip can be optionally interconnected, which facilitates the design, trial manufacture and the analysis of faults in multilayer IC chips in the mass-production process, and thereby the period of development stage is reduced, the mass-production line becomes operative within a short preparatory time, and the yield of the mass-production line is improved.

Although the invention has been described in its preferred forms with a certain degree of particularity, it is to be understood that many changes and variations are possible in the invention without departing from the scope thereof.

We claim:

1. An IC wiring connecting method for an IC device having conductive lines located under an insulating film, the wiring connecting method connecting the conductive lines to each other, comprising the steps of:

forming holes through the insulating film formed over the conductive lines, at separated positions of the insulating film, to expose each of the conductive lines to be interconnected, by irradiating a first focussed energy beam at the separated positions of the insulating film;

depositing metal in each of said holes to form respective metal wiring portions, by decomposing a gaseous metal compound by irradiating a second focussed energy beam at an interior of each of the holes in an atmosphere of the gaseous metal compound; and depositing metal wiring on a surface of the insulating film, extending from a metal wiring portion in a hole at one of the separated positions of the insulating film to a metal wiring portion in a hole at another of the separated positions of the insulating film, by decomposing the gaseous metal compound by irradiating a third focussed energy beam, so as to provide said metal wiring on the surface of the insulating film extending between the separated positions.

whereby the conductive lines are connected electrically by said metal wiring portions and said metal wiring.

2. An IC wiring connecting method as recited in claim 1, wherein said holes are taper holes tapering from the surface toward the interior of the IC chip.

3. An IC wiring connecting method as recited in claim 2, wherein said holes are formed as taper holes by using a focussed ion beam as the first focussed energy beam and sweeping the focussed ion beam to form the holes, the sweeping width of the focussed ion beam being varied so as to form the taper holes tapering downward.

4. An IC wiring connecting method as recited in claim 1, wherein said metal wiring and metal wiring portions are deposited by a focussed energy beam induced CVD process.

5. An IC wiring connecting method as recited in claim 4, wherein said second and third focussed energy beams are focussed laser beams such that said focussed energy beam induced CVD processes for depositing the metal wiring portions and metal wiring are laser beam induced CVD processes.

6. An IC wiring connecting method as recited in claim 4, wherein said second and third focussed energy beams are focussed electron beams such that said focussed energy beam induced CVD processes for depositing the metal wiring portions and metal wiring are electron beam induced CVD processes.

7. An IC wiring connecting method as recited in claim 1, wherein the third focussed energy beam and IC device move relative to one another so as to deposit the metal wiring on the surface of the insulating film extending between the separated position.

8. An IC wiring connecting method as recited in claim 1, wherein the first focussed energy beam is a focussed ion beam.

9. An IC wiring connecting method as recited in claim 8, wherein said second focussed energy beam is a laser beam.

10. An IC wiring connecting method as recited in claim 1, comprising the further step, after depositing the metal wiring portions and metal wiring, or forming a further insulating film over the metal wiring, by decomposing a gaseous non-metal compound by irradiating a fourth focussed energy beam over the metal wiring in an atmosphere containing said gaseous non-metal compound.

11. An IC wiring connecting method as recited in claim 10, wherein the fourth focussed energy beam and the IC device are moved relative to each other during the step of forming the further insulating film.

12. An IC wiring connecting method as recited in claim 10, wherein said further insulating film is an SiO$_2$ film.

13. An IC wiring connecting method as recited in claim 35, wherein said energy beam is a first focussed ion beam.

14. An IC wiring connecting method as recited in claim 1, wherein said gaseous metal compound is a gaseous organometallic compound.

15. An IC wiring connecting method as recited in claim 14, wherein said gaseous organometallic compound is a gaseous material selected from the group consisting of metal alkyls, metal carbonyls and metal alcooxides.

16. An IC wiring connecting method as recited in claim 1, wherein said gaseous metal compound is a gaseous metal halide.

17. An IC device made by the method of claim 1.

18. An IC wiring connecting method for a multilayer IC device having multilayer conductive lines therein, the multilayer IC device including upper and lower conductive lines sandwiching an intermediate insulating film, with an upper insulating film on the upper conductive line, comprising the steps of:
   forming a hole through the upper insulating film and the upper conductive line to the intermediate insulating film above the lower conductive line by irradiating a first focussed energy beam, so as to expose a surface forming the hole, the surface including exposed parts of the upper conductive line;
   forming an insulating layer over the surface forming the hole by depositing an insulating material, the insulating layer covering said exposed parts of the upper conductive line;
   processing the intermediate insulating film so as to expose the lower conductive line by irradiating the hole with a second focussed energy beam; and
   depositing a metal in the hole to form a metal wiring portion in contact with an exposed part of the lower conductive line by decomposing a gaseous metal compound by irradiating the hole with a third focussed energy beam in an atmosphere of the gaseous metal compound.

19. An IC wiring connecting method as recited in claim 18, wherein said insulating layer is formed so as to cover the exposed upper conductive line in said hole, whereby said metal wiring portion deposited over a surface of the insulating layer does not come into electrical contact with the upper conductive line.

20. An IC wiring connecting method as recited in claim 18, wherein said metal wiring portion is deposited by a focussed ion beam induced CVD process.

21. An IC wiring connecting method as recited in claim 20, wherein said third focussed energy beam is a focussed laser beam such that said focussed energy beam induced CVD process for depositing the metal wiring portion is a laser beam induced CVD process.

22. An IC wiring connecting method as recited in claim 20, wherein said third focussed energy beam is a focussed ion beam such that said focussed energy beam induced CVD process for depositing the metal wiring portion is an ion beam induced CVD process.

23. An IC wiring connecting method as recited in claim 20, wherein said third focussed energy beam is a focussed electron beam such that said focussed energy beam induced CVD process for depositing the metal wiring portion is an electron beam induced CVD process.

24. An IC wiring connecting method as recited in claim 20, wherein said second focussed energy beam is a focussed ion beam, and wherein the insulating layer is deposited by an ion beam induced CVD process.

25. An IC wiring connecting method as recited in claim 18, wherein the first focussed energy beam is a focussed ion beam.

26. An IC wiring connecting method as recited in claim 25, wherein said second focussed energy beam is a focussed laser beam, said insulating layer being formed by a laser beam induced CVD process.

27. An IC wiring connecting method as recited in claim 18, wherein said gaseous metal compound is a gaseous organometallic compound.

28. An IC wiring connecting method as recited in claim 27, wherein said gaseous organometallic compound is a gaseous material selected from the group consisting of metal alkyls, metal carbonyls and metal alcooxides.

29. An IC wiring connecting method as recited in claim 18, wherein said gaseous metal compound is a gaseous metal halide.

30. An IC device made by the method of claim 19.

31. An IC wiring connecting method for a multilayer IC device having multilayer conductive lines therein, the multilayer device including upper and lower conductive lines sandwiching an intermediate insulating film, with an upper insulating film on the upper conductive line, comprising the steps of:
   forming a hole through the upper insulating film and the upper conductive line to the intermediate insulating film above the lower conductive line by irradiating a first focussed energy beam at a position, so as to expose a surface forming the hole, the surface including exposed parts of the upper conductive line;
   forming an insulating layer over at least the surface forming the hole, the insulating layer covering said exposed parts of the upper conductive line;
   processing the intermediate insulating film so as to expose a part of the lower conductive line by irradiating the hole with a second focussed energy beam; and
   depositing a metal in the hole to form a metal wiring portion in contact with an exposed part of the lower conductive line by an energy beam induced CVD process by irradiating the hole with a third focussed energy beam in an atmosphere of a gaseous metal compound that is decomposed by the irradiating to deposit metal of the metal wiring portion.

32. An IC wiring connecting method as recited in claim 31, wherein said IC device includes a pad or bump conductive layer, wherein in depositing said insulating layer, said pad or bump conductive layer is covered with said insulating layer, and wherein the process includes the further step of etching the insulating layer so as to expose the pad or bump conductive layer.

33. An IC wiring connecting method as recited in claim 31, wherein said gaseous metal compound is a gaseous organometallic compound.

34. An IC wiring connecting method as recited in claim 33, wherein said gaseous organometallic compound is a gaseous material selected from the group consisting of metal alkyls, metal carbonyls and metal alcooxides.

35. An IC wiring connecting method as recited in claim 31, wherein said CVD process is a laser induced CVD process.

36. An IC wiring connecting method as recited in claim 31, wherein said CVD process is an ion induced CVD process.

37. An IC wiring connecting method as recited in claim 31, wherein said first focussed energy beam is a focussed ion beam.

38. An IC wiring connecting method as recited in claim 37, wherein the insulating layer is formed over the surface of the hole and an upper surface of the upper insulating film by a sputtering process.

39. An IC wiring connecting method as recited in claim 37, wherein said energy beam induced CVD process, for said depositing a metal wiring portion, is a laser beam induced CVD process.

40. An IC wiring connecting method as recited in claim 37, wherein the insulating film layer is formed over the surface of at least the hole by a CVD process.

41. An IC wiring connecting method as recited in claim 40, wherein said energy beam induced CVD process, for said depositing a metal wiring portion, is a laser beam induced CVD process.

42. An IC wiring connecting method as recited in claim 31, wherein said gaseous metal compound is a gaseous metal halide.

43. An IC device made by the method of claim 31.

* * * * *